US011710687B2

(12) United States Patent
Chew et al.

(10) Patent No.: US 11,710,687 B2
(45) Date of Patent: Jul. 25, 2023

(54) SEMICONDUCTOR PACKAGE WITH GUIDE PIN

(71) Applicant: SEMICONDUCTOR COMPONENTS INDUSTRIES, LLC, Phoenix, AZ (US)

(72) Inventors: Chee Hiong Chew, Seremban (MY); Yushuang Yao, Shenzhen (CN); Atapol Prajuckamol, Thanyaburi (TH); Chuncao Niu, Wuhan (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 459 days.

(21) Appl. No.: 16/502,441

(22) Filed: Jul. 3, 2019

(65) Prior Publication Data

US 2020/0373231 A1    Nov. 26, 2020

Related U.S. Application Data

(60) Provisional application No. 62/851,199, filed on May 22, 2019.

(51) Int. Cl.
*H01L 23/498* (2006.01)
*H05K 1/18* (2006.01)
*H01L 23/40* (2006.01)
*H01L 23/538* (2006.01)
*H01L 23/00* (2006.01)

(52) U.S. Cl.
CPC ........ *H01L 23/49811* (2013.01); *H01L 23/40* (2013.01); *H01L 23/49838* (2013.01); *H01L 23/5385* (2013.01); *H01L 23/562* (2013.01); *H05K 1/184* (2013.01); *H01L 2023/4087* (2013.01)

(58) Field of Classification Search
CPC ....... H01L 23/49811; H01L 2023/4087; H01L 23/5385; H01L 25/072; H05K 2201/09154; H05K 2201/10265; H05K 2201/1078; H05K 2201/10787; H05K 2201/10795; H05K 2201/10916
See application file for complete search history.

(56) References Cited

U.S. PATENT DOCUMENTS

| D775,091 S | 12/2016 | Edenharter et al. |
| D775,593 S | 1/2017 | Edenharter et al. |
| D776,071 S | 1/2017 | Edenharter et al. |
| 2013/0134572 A1* | 5/2013 | Lenniger ............ H01L 23/3677 257/690 |

(Continued)

OTHER PUBLICATIONS

Infineon Technologies AG, HybridPACK Drive Module—FS820R08A6P2LB, Final Data Sheet, V3.0, Mar. 23, 2017, 16 pages.

*Primary Examiner* — Julio J Maldonado
*Assistant Examiner* — Stanetta D Isaac
(74) *Attorney, Agent, or Firm* — Adam R. Stephenson, LTD.

(57) ABSTRACT

A semiconductor guide pin is disclosed. Specific implementations may include a heatsink, one or more substrates coupled together, one or more pressfit pins coupled to the one or more substrates, and two or more guide pins coupled to the one or more substrates, where the two or more guide pins may have a height greater than the one or more pressfit pins.

18 Claims, 6 Drawing Sheets

(56) References Cited

U.S. PATENT DOCUMENTS

2014/0361424 A1* 12/2014 Horio .................... H01L 23/043
                                                          257/704
2016/0247735 A1*  8/2016 Lin ....................... H01R 4/489
2017/0118858 A1   4/2017 Cheng
2018/0338376 A1* 11/2018 Terashima ........ H01L 23/49811

* cited by examiner

SEMICONDUCTOR PACKAGE WITH GUIDE PIN

CROSS REFERENCE TO RELATED APPLICATIONS

This application claims the benefit of the filing date of U.S. Provisional Patent Application 62/851,199, entitled "SEMICONDUCTOR PACKAGE WITH GUIDE PIN" to Chew et al., which was filed on May 22, 2019, the disclosure of which is hereby incorporated entirely herein by reference.

BACKGROUND

1. Technical Field

Aspects of this document relate generally to semiconductor packages. More specific implementations involve guide pins used in coupling substrates.

2. Background

Semiconductor substrates are generally coupled using a number of pressfit pins. Semiconductor guide pins may be used to align the pressfit pins in order to couple the substrates.

SUMMARY

Implementations of a semiconductor package may include: one or more substrates coupled together; one or more pressfit pins coupled to the one or more substrates; and two or more guide pins coupled to the one or more substrates; where the two or more guide pins may have a height greater than the one or more pressfit pins.

Implementations of a semiconductor package may include one, all, or any of the following:

The two or more guide pins may be coupled around the perimeter of a first side of the one or more substrates.

The two or more guide pins may be coupled on a first side of the one or more substrates and extend therefrom.

A first guide pin of the two or more guide pins may be coupled near a corner of a first substrate of the one or more substrates; a second guide pin of the two or more guide pins may be coupled on a side of a second substrate of the one or more substrates; and a third guide pin of the two or more guide pins may be coupled near a corner of a third substrate of the one or more substrates; where the first guide pin, second guide pin, and third guide pin may be aligned on a line passing diagonally across the first substrate, second substrate, and third substrate.

The pressfit pins and the guide pins may extend through a cover coupled over the one or more substrates.

A first guide pin of the two or more guide pins may be coupled near a corner of a first substrate of the one or more substrates; a second guide pin of the two or more guide pins may be coupled near a first corner of a second substrate of the one or more substrates; a third guide pin of the two or more guide pins may be coupled near a second corner of the second substrate; and a fourth guide pin of the two or more guide pins may be coupled near a corner of a third substrate of the one or more substrates; where the first guide pin and the second guide pin, along with the third guide pin and the fourth guide pin may be aligned in a paired diagonal configuration.

A plurality of die may be coupled to the one or more substrates.

Each of the two or more guide pins may include a stress relief portion coupled to the one or more substrates.

Implementations of a semiconductor package may include: one or more substrates coupled together; one or more pressfit pins coupled to the one or more substrates; and two or more guide pins coupled to the one or more substrates; where the two or more guide pins may be configured to align the one or more pressfit pins with corresponding openings in a printed circuit board.

Implementations of a semiconductor package may include one, all, or any of the following:

The two or more guide pins may be coupled on a first side of the one or more substrates and extend therefrom.

A first guide pin of the two or more guide pins may be coupled near a corner of a first substrate of the one or more substrates; a second guide pin of the two or more guide pins may be coupled on a side of a second substrate of the one or more substrates; and a third guide pin of the two or more guide pins may be coupled near a corner of a third substrate of the one or more substrates; where the first guide pin, second guide pin, and third guide pin may be aligned on a line passing diagonally across the first substrate, second substrate, and third substrate.

The pressfit pins and the guide pins may extend through a cover coupled over the one or more substrates.

A first guide pin of the two or more guide pins may be coupled near a corner of a first substrate of the one or more substrates; a second guide pin of the two or more guide pins may be coupled near a first corner of a second substrate of the one or more substrates; a third guide pin of the two or more guide pins may be coupled near a second corner of the second substrate; and a fourth guide pin of the two or more guide pins may be coupled near a corner of a third substrate of the one or more substrates. The first guide pin and the second guide pin, along with the third guide pin and the fourth guide pin may be aligned in a paired diagonal configuration.

A plurality of die may be coupled to the one or more substrates.

Each of the two or more guide pins may include a stress relief portion coupled to the one or more substrates.

Implementations of a semiconductor guide pin may include: a first portion coupled with a stress relief portion. The stress relief portion may be configured to be coupled to a substrate or to a heatsink (or both a substrate and a heatsink) where the first portion may be configured to extend into an opening in a printed circuit board to align a plurality of pressfit pins with a plurality of openings in the printed circuit board.

Implementations of a semiconductor package may include one, all, or any of the following:

The guide pin may not form an electrical connection.

The stress relief portion may include a waved shape.

The stress relief portion may include a stop.

A first end of the first portion may be beveled.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages with guide pins will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages with guide pins, and implementing components and methods, consistent with the intended operation and methods.

Figure 1:
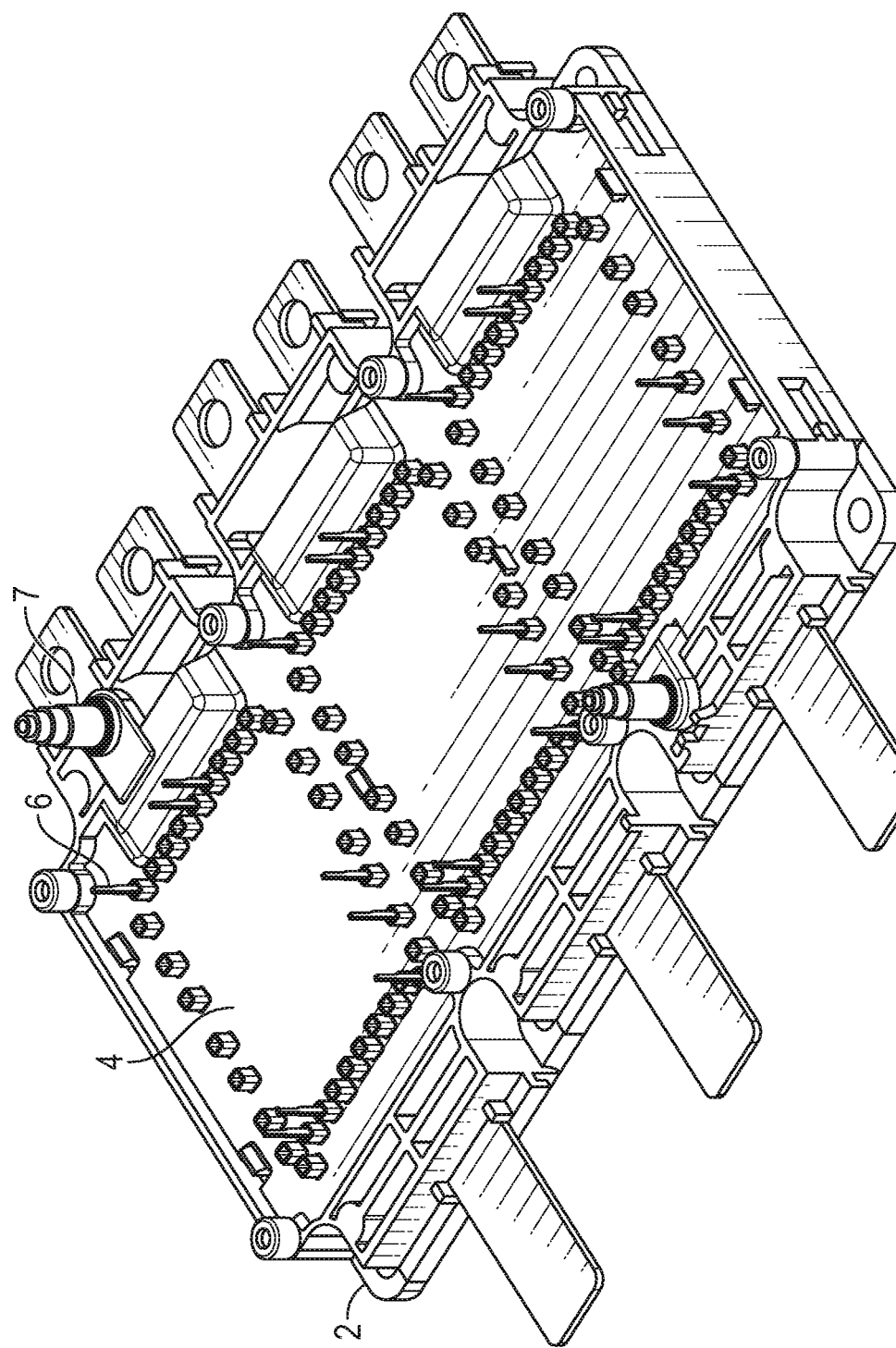
FIG. 1 illustrates a semiconductor package with guide pillars.

Referring to FIG. 1, a semiconductor package with guide pillars 7 is illustrated. As illustrated, a substrate 4 is coupled to a heatsink 2. In various implementations, there may be one or more substrates coupled together, or disposed on top of one another, and, in various implementations, may be coupled to a heatsink 2. As illustrated, a pressfit pin 6 is coupled to the substrate 4. In various implementations, there may be two or more pressfit pins 6 coupled to the substrate 4 or substrates. As illustrated, the guide pillar 7 may also be coupled to the heatsink 2 through being molded into the case/cover placed over the substrate 4 and pressfit pins 6. In such implementations, the alignment of the guide pillar 7 with the pressfit pins 6 is controlled by the alignment of the case/cover with the substrate 4 and/or the fabrication tolerance of the case/cover. Furthermore, when the guide pillar 7 is inserted into a guide opening in a circuit board into which the semiconductor package is going to be inserted the ability of the guide pillar 7 to guide the pressfit pins 6 into the pin openings in the circuit board is also determined by the tolerance of the opening in the circuit board into which the guide pillar 7 is inserted. Because of the large difference between diameter of the guide pillar 7 and the pressfit pins 6, a relatively insignificant tolerance difference between the guide pillar 7 and opening may be half or more the width/diameter of the pressfit pins 6, causing serious difficulty in using the guide pillar 7 to accurately align the pressfit pins 6 with the pin openings in the circuit board. Because the guide pillars may have a high offset tolerance value compared with the pressfit pins themselves, the guide pillar 7 may not allow for the proper alignment of a printed circuit board with one or more pressfit pins 6, resulting in an inability to insert the semiconductor package into the circuit board or in pressfit pin damage during insertion.

Figure 2:
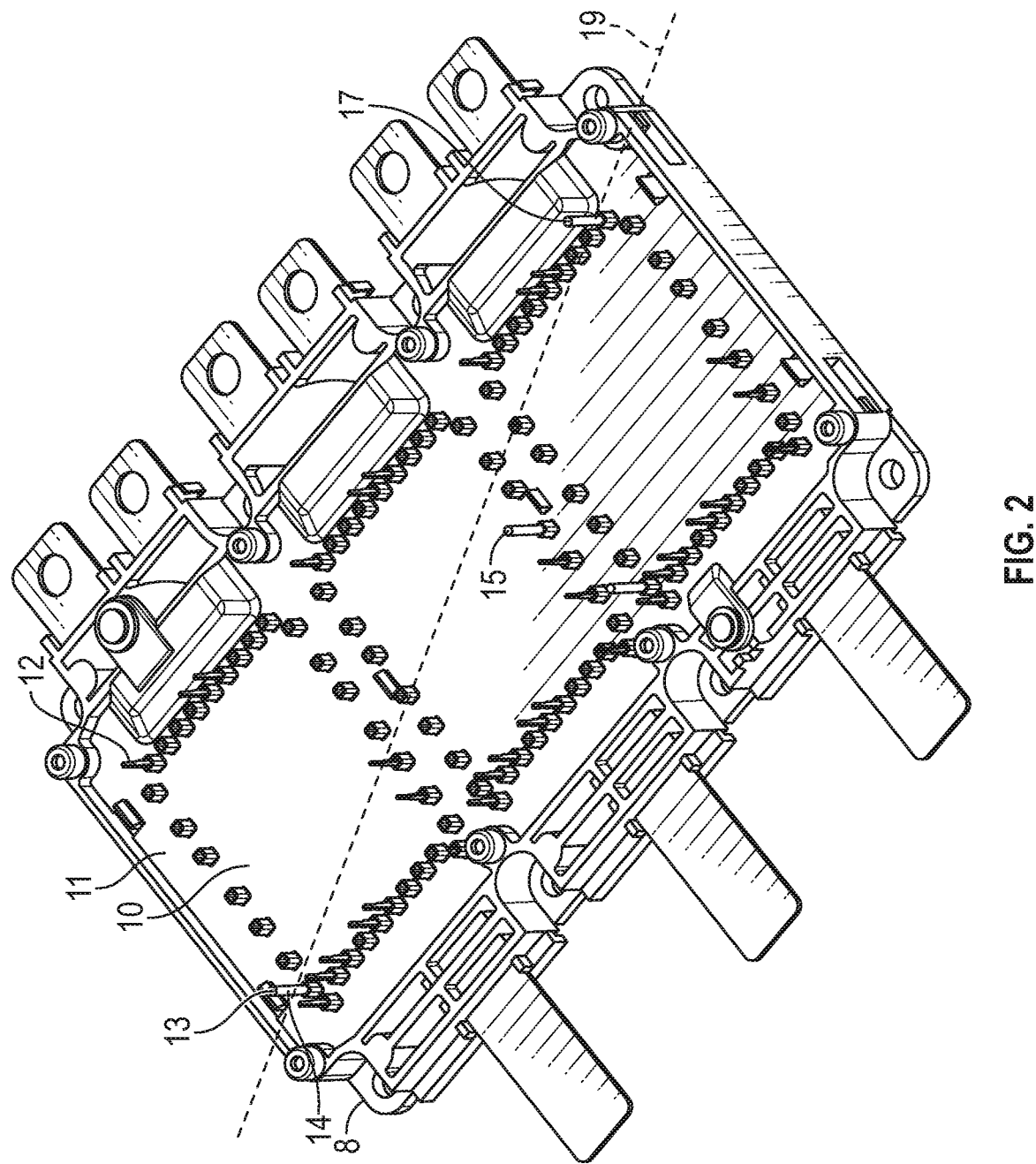
FIG. 2 illustrates a semiconductor package with guide pins.

Referring to FIG. 2, a semiconductor package with guide pins is illustrated. As illustrated, a pressfit pin 12 is coupled to the first side 11 of a substrate which in FIG. 2 is illustrated as being covered by cover 10. In various implementations, there may be one or more pressfit pins 12 coupled to the first side 11 of the substrate which extend through various pin openings in the cover 10. In various implementations, the pressfit pins 12 may be configured to form a bond between a substrate and a printed circuit board, or between two or more substrates, without the need for soldering through the electrical connection through the pins. In such implementations, an electrical connection may be formed via the pin openings in contact with the pressfit pins. In other various implementations, one or more substrates may be coupled together through the pins. As illustrated, a heatsink 8 is coupled on the opposite side of the cover 10 against the surface of the substrate that opposes the surface to which the pressfit pins are coupled to. As illustrated, a guide pin 14 is coupled to the first side 11 of the substrate and extends through an opening in cover 10. In various implementations, two or more guide pins 14 may be coupled to the substrate in order to provide needed alignment between the semiconductor package and the pressfit pin openings of the circuit board. In other various implementations, the guide pins may be coupled directly to the heatsink 8 and extend through an opening in the substrate. In various implementations, the guide pins may be coupled to the substrate or heatsink through various techniques, including, by non-limiting example, soldering, screwing, friction force insertion into an opening, and any other method of fixedly fastening a guide pin to a determined location.

As illustrated, the guide pin 14 in the implementation in FIG. 2 has a height greater than the pressfit pin 12. However, in various implementations, the guide pin 14 may have a height that is substantially the same as one or more of the pressfit pins 12. In various implementations, by non-limiting example, as illustrated in FIG. 2, the guide pin 14 has a larger diameter/width than the pressfit pin 12 but one which is several times smaller than the guide pillar 7 illustrate in FIG. 1. In various implementations, the guide pin 14 is of any length taller than a length of one or more of the pressfit pins 12. As illustrated, the guide pins 14 may extend from the first side 11 of the substrate, or from another surface of the substrate in the same direction as the pressfit pins 12. As illustrated, two or more guide pins 14 may be coupled around the perimeter of the first side 11 of the substrate 10. In various implementations, the guide pin 14 may be made from plastic, rubber, porcelain, or any other electrically non-conductive material. In other implementations, the guide pin 14 may be made of a metal, metal alloy, or composite material. In various implementations, the guide pin 14 may not form an electrical connection between elements of the semiconductor package. This may be accomplished through the insulating properties of the material of the guide pin or through coupling the guide pin on a portion of the substrate which is not connected to electrical power.

Still referring to FIG. 2, the guide pins 14 may be spaced apart from one another, or grouped, according to any pattern around the perimeter of the substrate, around the surface of the substrate, or in any other configuration extending from the substrate through a surface of the cover 10. In various implementations, where more than one substrate is included in the semiconductor package and all are arranged in a planar configuration like that in FIG. 2, a first guide pin 13 may be coupled near a corner of a first substrate, a second guide pin 15 may be coupled on a side of a second substrate, and a third guide pin 17 may be coupled near a corner of a third substrate. In such implementations (as illustrated in FIG. 2), the first guide pin 13, second guide pin 15, and third guide pin 17 may be aligned on a line 19 passing diagonally or substantially diagonally across the largest planar surface of the first substrate, second substrate, and third substrate.

Figure 3:
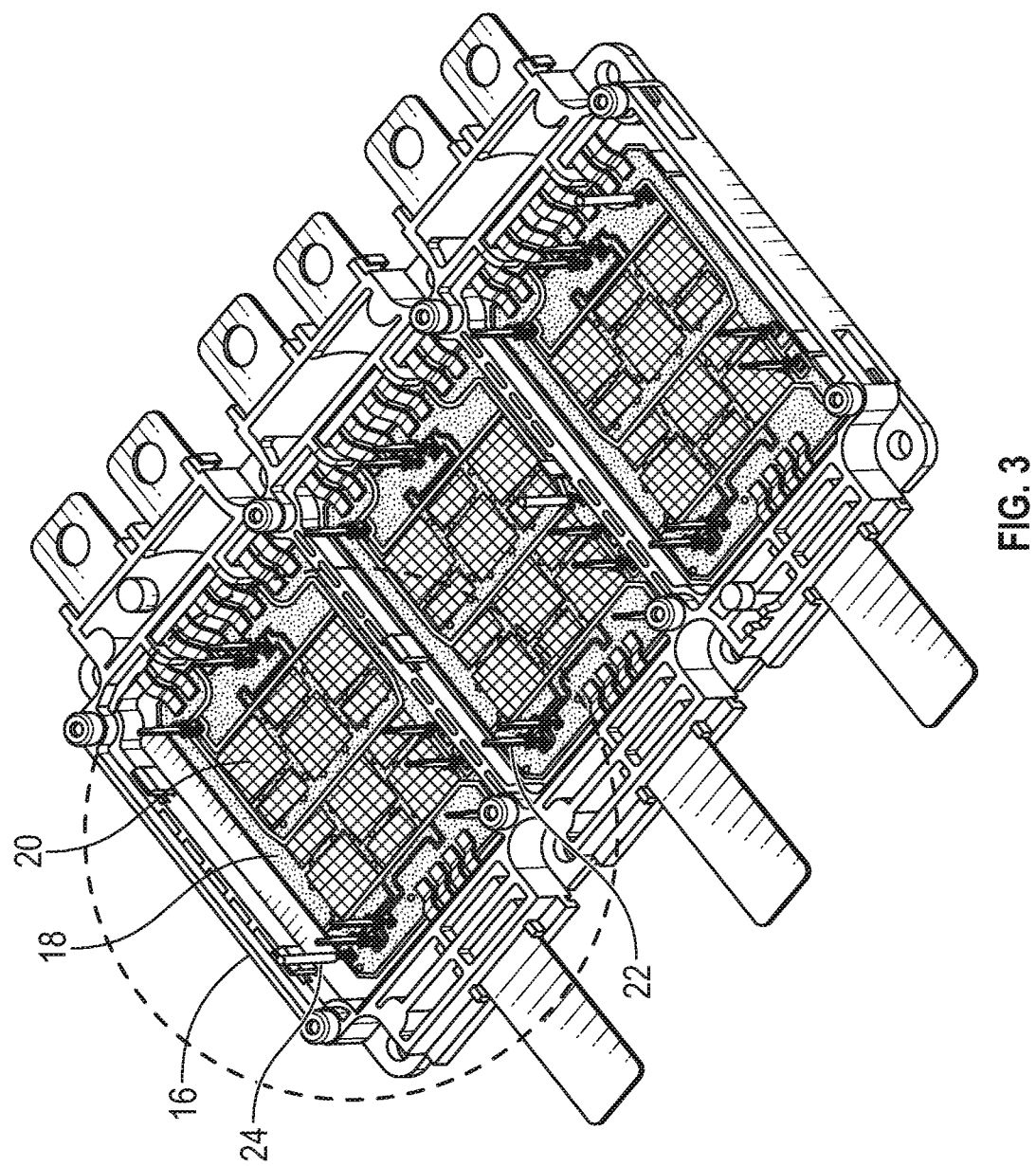
FIG. 3 illustrates a semiconductor package with guide pins and semiconductor die coupled to the substrate.

Referring to FIG. 3, a semiconductor package with guide pins and semiconductor die coupled to the substrate like the one illustrated in FIG. 2 is illustrated with the cover 10 removed. As illustrated, the substrate 18 is coupled to a heatsink 16 on the side of the substrate 18 opposite the one visible in FIG. 3. As illustrated, a plurality of pressfit pins 22 and three guide pins 24 are coupled to the substrate 18. In other various implementations, the guide pins 24 are coupled directly to the heatsink 16 through an opening in the substrate 18. While three guide pins 24 are illustrated as being used in the implementation illustrated in FIG. 3, more or only two guide pins 24 may be employed in various package implementations. As illustrated, a semiconductor die 20 may be coupled to the substrate. In various implementations, there may be one or more semiconductor die 20 coupled to the substrate 18. In such implementations, the semiconductor die 20 are coupled to the substrate 18 via various electrical connections. In various implementations, the guide pin 24 or guide pins may not form an electrical connection with the various components or elements of the semiconductor package. This may be accomplished through the material of the guide pin or through coupling the guide pin at a location on the substrate 18 that is not connected to electrical power.

In various implementations, the guide pin 24 or guide pins may guide the connection, or coupling, of the plurality of pressfit pins 12 to a corresponding plurality of pin openings in a printed circuit board, another substrate, or another semiconductor package element, allowing the coupled element to connect with the substrate 18 via the pressfit pins 22 with a low offset tolerance value. In various implementations, by non-limiting example, the offset tolerance value may be about 0.4 mm.

Figure 4:
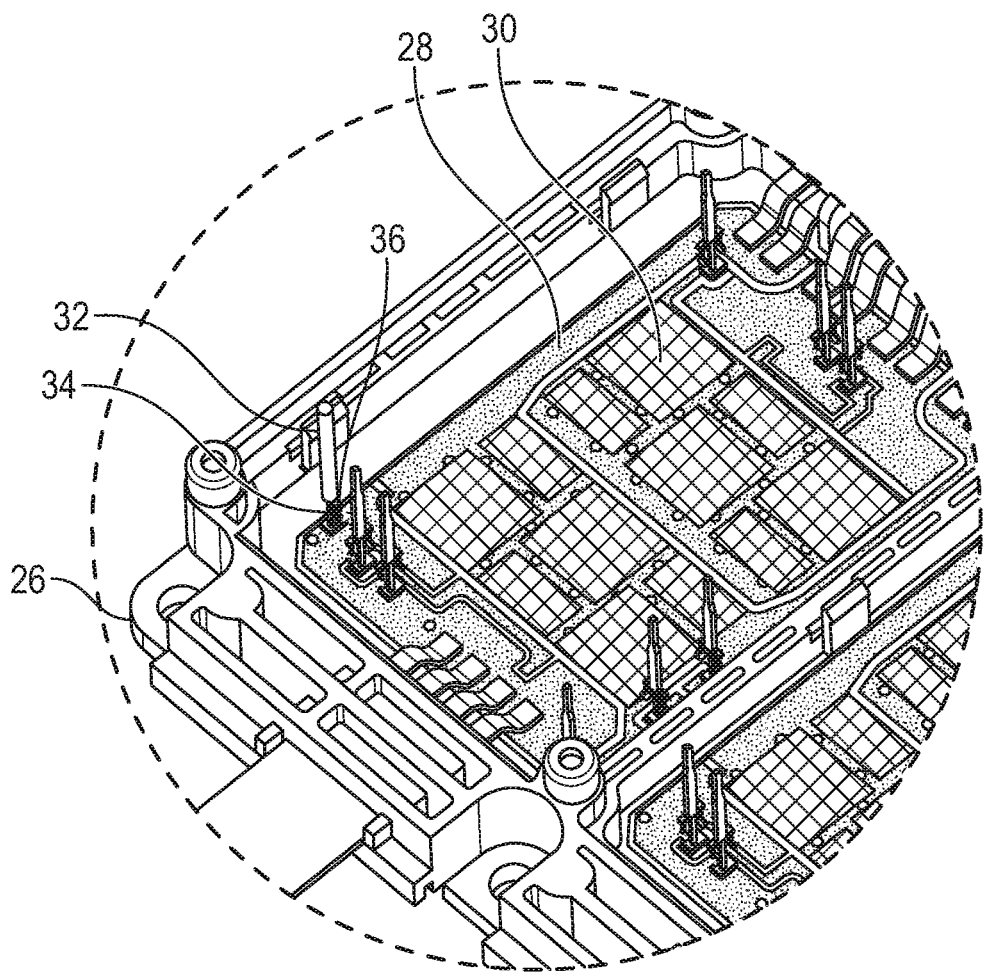
FIG. 4 illustrates a magnified view of a guide pin as shown in FIG. 3.

Referring to FIG. 4, a magnified view of a guide pin coupled to a substrate 28 like that illustrated in FIG. 3 is illustrated. As illustrated, a number of semiconductor die 30 are coupled to a substrate 28. The semiconductor die 30 may be any of wide variety of device types, including, by non-limiting example, power semiconductor devices, bipolar junction transistors, insulated gate bipolar transistors, silicon controlled rectifiers, switching devices, and any other semiconductor device type. In other implementations, various other passive components may be coupled to the substrate, such as, by non-limiting example, capacitors, resistors, inductors, or any other discrete component type. As illustrated, the substrate 28 is be coupled to a heatsink 26. As illustrated, a guide pin may include a first portion 32 and a stress relief portion 34. In such implementations, the first portion 32 of the guide pin may be a portion 36 of the guide pin that is opposite a second portion of the guide pin that is coupled to the substrate 28.

Figure 6:
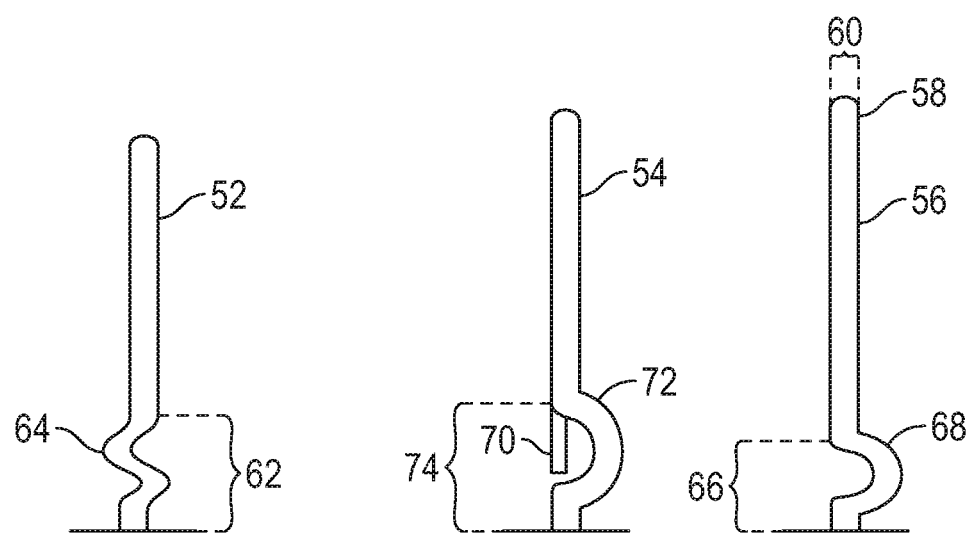
FIG. 6 illustrates three implementations of a guide pin.

Referring to FIG. 6, a detail side view of three implementations of guide pins 52, 54, 56 is illustrated. As illustrated, a first end of the first portion of the guide pin 56 may be beveled 60. Also as illustrated, in various guide pin implementations, the stress relief portion 62 may form a waved shape 64. In such implementations, the stress relief portion 62 may allow movement of the guide pin as the printed circuit board is coupled to the substrate over the guide pin and pressfit pins. In this way, alignment of the printed circuit board over the substrate may be achieved without causing the pressfit pins to crack or separate from the substrate. In other guide pin implementations, the stress relief portion 66 includes a curved shape 68 as illustrated.

Still referring to FIG. 6, the guide pin 54 may also include a stop 70. In various implementations, the stop 70 is used in combination with one or more curved or waved sections 72 included in the stress relief portion 74. The stop 70 acts to prevent the guide pin from being deflected beyond the length of the stop 70 under the insertion force pushing the semiconductor package against the circuit board. This prevents the guide pin 54 from being irreversibly deflected and aids in forcing the guide pin 54 up through the opening in the circuit board under the insertion force.

While in the various drawings in this document the non-stress relief sections of the guide pin implementations illustrated herein areas being substantially cylindrical, in various implementations, the guide pin may have any of a wide variety of cross sectional shapes, including, by non-limiting example, circular, elliptical, rectangular, square, irregular, or any other closed shape. In other guide pin implementations, the shape of the portion of the pin that is not part of a stress relief section may not be formed of a single cross sectional shape, but may be, by non-limiting example, conical, pyramidal shape, multi-pyramidal, multi-pyramidal, multi-conical, stepped, or any other combination of portions each with varying closed cross sectional shapes.

Figure 5:
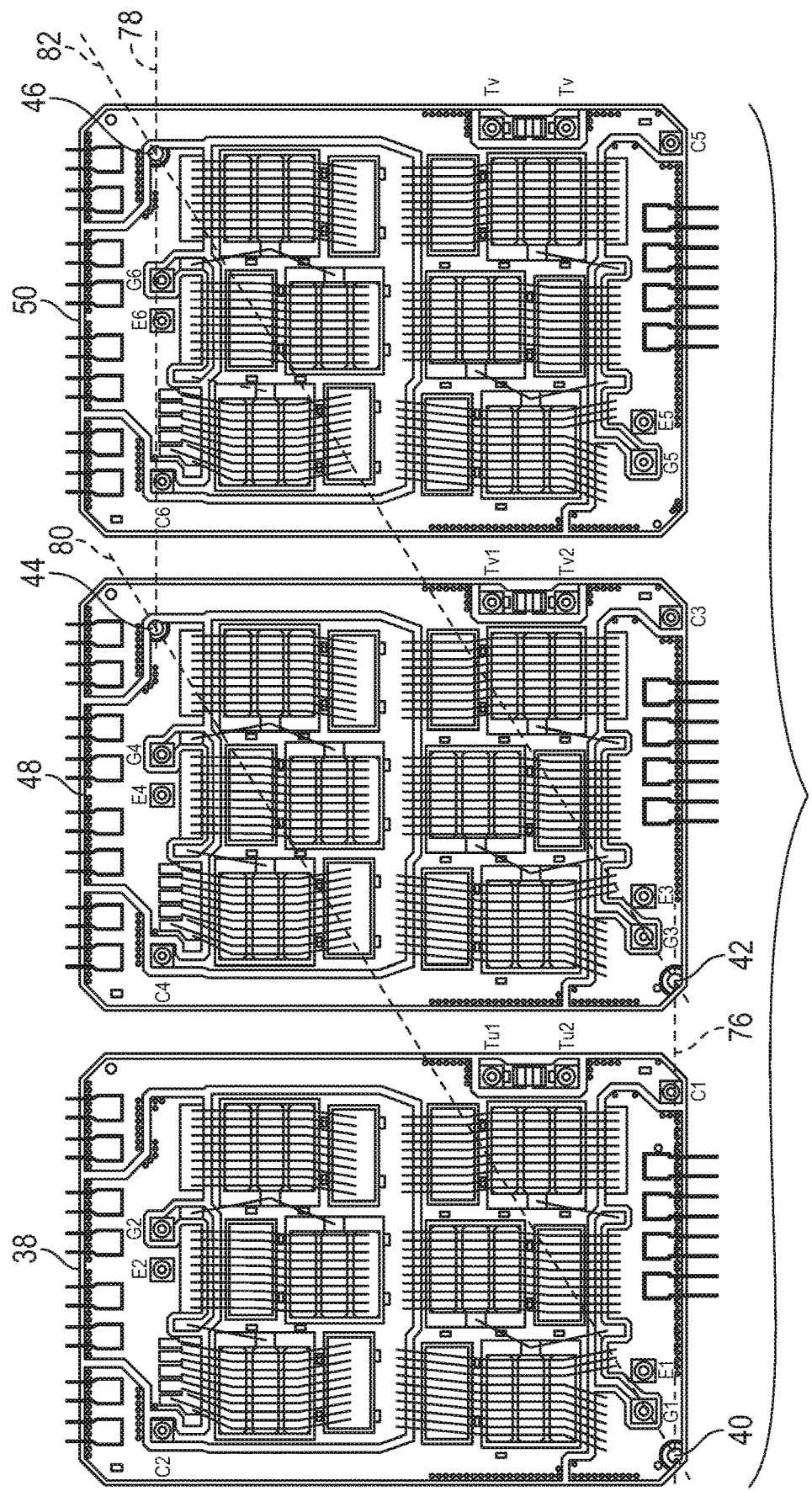
FIG. 5 illustrates a semiconductor package with guide pins in a paired diagonal configuration.

Referring to FIG. 5, a top view of three substrates for a semiconductor package each with guide pins arranged in a paired diagonal configuration is illustrated. As illustrated, when the substrates are arranged in a plane adjacent to one another in the order illustrated in FIG. 5, a first guide pin 40 is coupled to/through first substrate 38. First guide pin 40 is aligned with a second guide pin 42 coupled to/through second substrate 48 on a first line 76. A third guide pin 44 coupled to/through second substrate 48 is aligned with a fourth guide pin 46 coupled to/through third substrate 50 on a second line 78. In such implementations, the pair of the first guide pin 40 and the second guide pin 42 and the pair of the third guide pin 44 and the fourth guide pin 46 form a paired diagonal configuration aligned on diagonal lines 80, 82. In such implementations, the first guide pin 40, second guide pin 42, third guide pin 44, and fourth guide pin 46 may be positioned on corners of the substrates. In other various implementations, by non-limiting example, the guide pins may be positioned at any other paired diagonally arranged locations on the substrates. Maintaining the diagonal arrangement of the two pairs of guide pins allows the semiconductor package to ensure that when the guide pins are aligned with the guide pin openings in the circuit board the plurality of pressfit pins will also be aligned with the corresponding pressfit pin openings, permitting insertion of the semiconductor package into the circuit board.

In various implementations, by non-limiting example, the substrates may be any of wide variety of substrate types, including by non-limiting example a direct bond copper (DBC) substrate, an active metal brazed (AMB) substrate, an aluminum nitride (AlN) substrate), a laminated substrate, a glass reinforced epoxy laminate substrate, and any other substrate type capable of having die and other components coupled thereto.

In places where the description above refers to particular implementations of semiconductor packages with guide pins and implementing components, sub-components, methods and sub-methods, it should be readily apparent that a number of modifications may be made without departing from the spirit thereof and that these implementations, implementing components, sub-components, methods and sub-methods may be applied to other semiconductor packages with guide pins.

What is claimed is:
1. A semiconductor package, comprising:
one or more substrates coupled together;
one or more pressfit pins coupled to the one or more substrates; and two or more guide pins coupled directly on a first side of the one or more substrates;
wherein the two or more guide pins have a height greater than the one or more pressfit pins.

2. The semiconductor package of claim 1, wherein the two or more guide pins are coupled around a perimeter of a first side of the one or more substrates.

3. The semiconductor package of claim 1, further comprising:
a first guide pin of the two or more guide pins coupled near a corner of a first substrate of the one or more substrates;
a second guide pin of the two or more guide pins coupled on a side of a second substrate of the one or more substrates; and
a third guide pin of the two or more guide pins coupled near a corner of a third substrate of the one or more substrates;
wherein the first guide pin, second guide pin, and third guide pin are aligned on a line passing diagonally across the first substrate, second substrate, and third substrate.

4. The semiconductor package of claim 1, wherein the one or more pressfit pins and the two or more guide pins extend through a cover coupled over the one or more substrates.

5. The semiconductor package of claim 1, further comprising:
a first guide pin of the two or more guide pins coupled near a corner of a first substrate of the one or more substrates;
a second guide pin of the two or more guide pins coupled near a first corner of a second substrate of the one or more substrates;
a third guide pin of the two or more guide pins coupled near a second corner of the second substrate;
a fourth guide pin of the two or more guide pins coupled near a corner of a third substrate of the one or more substrates;
wherein the first guide pin and the second guide pin, along with the third guide pin and the fourth guide pin are aligned in a paired diagonal configuration.

6. The semiconductor package of claim 1, further comprising a plurality of die coupled to the one or more substrates.

7. The semiconductor package of claim 1, wherein each of the two or more guide pins comprises a stress relief portion coupled to the one or more substrates.

8. A semiconductor package, comprising:
one or more substrates coupled together;
one or more pressfit pins coupled to the one or more substrates; and
two or more guide pins directly coupled to the one or more substrates;
wherein the two or more guide pins are configured to align the one or more pressfit pins with corresponding openings in a printed circuit board.

9. The semiconductor package of claim 8, wherein the two or more guide pins are coupled on a first side of the one or more substrates and extend therefrom.

10. The semiconductor package of claim 8, further comprising:
a first guide pin of the two or more guide pins coupled near a corner of a first substrate of the one or more substrates;
a second guide pin of the two or more guide pins coupled on a side of a second substrate of the one or more substrates; and
a third guide pin of the two or more guide pins coupled near a corner of a third substrate of the one or more substrates;
wherein the first guide pin, second guide pin, and third guide pin are aligned on a line passing diagonally across the first substrate, second substrate, and third substrate.

11. The semiconductor package of claim 8, wherein the one or more pressfit pins and the two or more guide pins extend through a cover coupled over the one or more substrates.

12. The semiconductor package of claim 8, further comprising:
a first guide pin of the two or more guide pins coupled near a corner of a first substrate of the one or more substrates;
a second guide pin of the two or more guide pins coupled near a first corner of a second substrate of the one or more substrates;
a third guide pin of the two or more guide pins coupled near a second corner of the second substrate;
a fourth guide pin of the two or more guide pins coupled near a corner of a third substrate of the one or more substrates;
wherein the first guide pin and the second guide pin, along with the third guide pin and the fourth guide pin are aligned in a paired diagonal configuration.

13. The semiconductor package of claim 8, further comprising a plurality of die coupled to the one or more substrates.

14. The semiconductor package of claim 8, wherein each of the two or more guide pins comprises a stress relief portion coupled to the one or more substrates.

15. A semiconductor guide pin, comprising:
a first portion coupled with a stress relief portion, the stress relief portion configured to be coupled to a substrate or a heatsink;
wherein the first portion is configured to extend into an opening in a printed circuit board to align a plurality of pressfit pins with a plurality of openings in the printed circuit board; and
wherein the guide pin is configured to be electrically isolated when coupled to the substrate.

16. The guide pin of claim 15, wherein the stress relief portion comprises a waved shape.

17. The guide pin of claim 15, wherein the stress relief portion comprises a stop.

18. The guide pin of claim 15, wherein a first end of the first portion is beveled.

* * * * *